United States Patent
Reynov et al.

(10) Patent No.: US 9,901,007 B1
(45) Date of Patent: Feb. 20, 2018

(54) REMOVABLE BOARD WITH COOLING SYSTEM FOR CHASSIS-BASED ELECTRONIC EQUIPMENT

(71) Applicant: Juniper Networks, Inc., Sunnyvale, CA (US)

(72) Inventors: Boris Reynov, Cupertino, CA (US); Shreeram Siddhaye, Sunnyvale, CA (US); Venkata S. Raju Penmetsa, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 23 days.

(21) Appl. No.: 14/700,220

(22) Filed: Apr. 30, 2015

(51) Int. Cl.
*H05K 7/20* (2006.01)
*H05K 7/14* (2006.01)

(52) U.S. Cl.
CPC ....... *H05K 7/20309* (2013.01); *H05K 7/1427* (2013.01); *H05K 7/20136* (2013.01); *H05K 7/20318* (2013.01); *H05K 7/20327* (2013.01)

(58) Field of Classification Search
CPC .......... H05K 7/20309; H05K 7/20136; H05K 7/1427; H05K 7/20318; H05K 7/20327
USPC ........................................ 361/696, 701, 724
See application file for complete search history.

(56) References Cited

U.S. PATENT DOCUMENTS

| | | | | |
|---|---|---|---|---|
| 4,237,546 A * | 12/1980 | Wells | ........................ | H05K 1/14 361/679.31 |
| 5,285,347 A * | 2/1994 | Fox | ........................ | G06F 1/20 165/80.3 |
| 6,989,990 B2 * | 1/2006 | Malone | ....................... | G06F 1/20 165/104.33 |
| 7,002,799 B2 * | 2/2006 | Malone | ............... | H05K 7/20727 165/80.4 |
| 7,372,698 B1 * | 5/2008 | Tilton | ................. | H05K 7/20772 165/104.33 |
| 2001/0029907 A1 * | 10/2001 | Algrain | ...................... | F01P 3/18 123/41.29 |
| 2002/0164944 A1 * | 11/2002 | Haglid | ................ | B25B 27/0035 454/228 |
| 2008/0316704 A1 * | 12/2008 | Vinson | ....................... | G06F 1/20 361/695 |
| 2010/0061853 A1 * | 3/2010 | Bagepalli | ............. | H02K 7/1823 416/95 |

\* cited by examiner

*Primary Examiner* — Dion R Ferguson
*Assistant Examiner* — Mandeep S Buttar
(74) *Attorney, Agent, or Firm* — Harrity & Harrity, LLP

(57) ABSTRACT

A system may include a removable board that is adapted for inserting into and removing from an enclosure, an electronic component that is attached to the removable board, and a cooling system that is attached to the removable board. The cooling system may include a first heat exchanger that is attached to the electronic component by a physical interface. The cooling system may include a coolant pipe that that is at least partially filled with a working fluid to receive heat, generated by the electronic component, via the first heat exchanger. The cooling system may include a second heat exchanger, attached to the coolant pipe and situated to be located outside of the enclosure when the removable board is inserted into the enclosure. The cooling system may be adapted to remain attached to the removable board when inserting and removing the removable board.

20 Claims, 6 Drawing Sheets

REMOVABLE BOARD WITH COOLING SYSTEM FOR CHASSIS-BASED ELECTRONIC EQUIPMENT

BACKGROUND

A cooling system may manage and/or dissipate heat generated by an electronic component, such as a processor, an integrated circuit, or the like. The electronic component, and part or all of the cooling system, may be enclosed in an enclosure to protect the electronic component from contamination and/or damage, to facilitate operation of the electronic component, or the like.

SUMMARY

According to some possible implementations, a system may include an enclosure and a plurality of removable boards inserted within the enclosure. A removable board, of the plurality of removable boards, may include a substrate, an electronic component attached to the substrate, and/or an internal heat exchanger to receive heat from the electronic component. The internal heat exchanger may be attached to at least one of the electronic component or the removable board. The removable board may include a coolant pipe that is at least partially filled with a working fluid and that is attached to the internal heat exchanger. The removable board may include an external heat exchanger that is located external to the enclosure and that is attached to the coolant pipe to dissipate heat from the electronic component. The removable board may facilitate insertion into and removal from the enclosure without removing any component of the removable board.

According to some possible implementations, a removable board may be adapted to be inserted into and to be removed from an enclosure. The removable board may include a substrate, an electronic component attached to the substrate, a first heat exchanger that shares a physical interface with the electronic component to dissipate heat generated by the electronic component, and/or a coolant pipe attached to the first heat exchanger. The coolant pipe may be at least partially filled with a working fluid. The removable board may include a second heat exchanger that is attached to the coolant pipe to dissipate heat from the working fluid. The second heat exchanger may be situated externally to the enclosure when the removable board is inserted into the enclosure.

According to some possible implementations, a system may include a removable board that is adapted for inserting into and removing from an enclosure, an electronic component that is attached to the removable board, and a cooling system that is attached to the removable board. The cooling system may include a first heat exchanger that is attached to the electronic component by a physical interface. The cooling system may include a coolant pipe that that is at least partially filled with a working fluid to receive heat, generated by the electronic component, via the first heat exchanger. The cooling system may include a second heat exchanger, attached to the coolant pipe and situated to be located outside of the enclosure when the removable board is inserted into the enclosure. The cooling system may be adapted to remain attached to the removable board when inserting and removing the removable board.

DETAILED DESCRIPTION

The following detailed description of example implementations refers to the accompanying drawings. The same reference numbers in different drawings may identify the same or similar elements.

An electronic component, such as a processor, an integrated circuit, an application-specific integrated circuit (ASIC), or the like, may generate heat while operating. A cooling system may manage the heat generated by the electronic component. For example, the cooling system may dissipate heat from the electronic component and/or an environment associated with the electronic component, such as an enclosure that encloses the electronic component. To dissipate the heat, the cooling system may circulate air (e.g., by ventilation of the electronic component and/or the enclosure), may receive and/or dissipate heat via a physical interface that transfers heat from the electronic component, may use working fluid in a heat pipe to transport heat away from the electronic component, or the like.

However, the electronic component may be enclosed in an enclosure, which may hinder operation of some types of cooling systems. Furthermore, as electronic components become smaller and/or more densely packed in an enclosure, some types of cooling systems may become increasingly ineffective at managing the heat generated by the more densely packed electronic components. For example, a ventilation cooling system may be incapable of causing airflow sufficient to dissipate the heat, may require significant power to cause the airflow, and/or may introduce contaminants to the electronic components. Further still, a liquid cooling system may be difficult to implement in a densely packed enclosure based on difficulty of maintenance, based on damage caused by leaking working fluid, based on a lack of a heat exchanger located external to the enclosure via which to dissipate heat energy, or the like.

Implementations described herein may manage the heat generated by the electronic component using a cooling system. An external heat exchanger may dissipate the heat externally to the enclosure, unhindered by space and operation constraints within the enclosure (e.g., using cost-effective and easily implemented ventilation techniques). A coolant pipe and/or an internal heat exchanger may be fabricated to prevent leaks during installation and/or removal of the coolant pipe and/or the internal heat exchanger. Further, installation and/or de-installation of the cooling system may be simplified by an enclosure adapted for insertion and/or removal of removable boards to which the cooling system and the electronic components are affixed.

Figure 1:
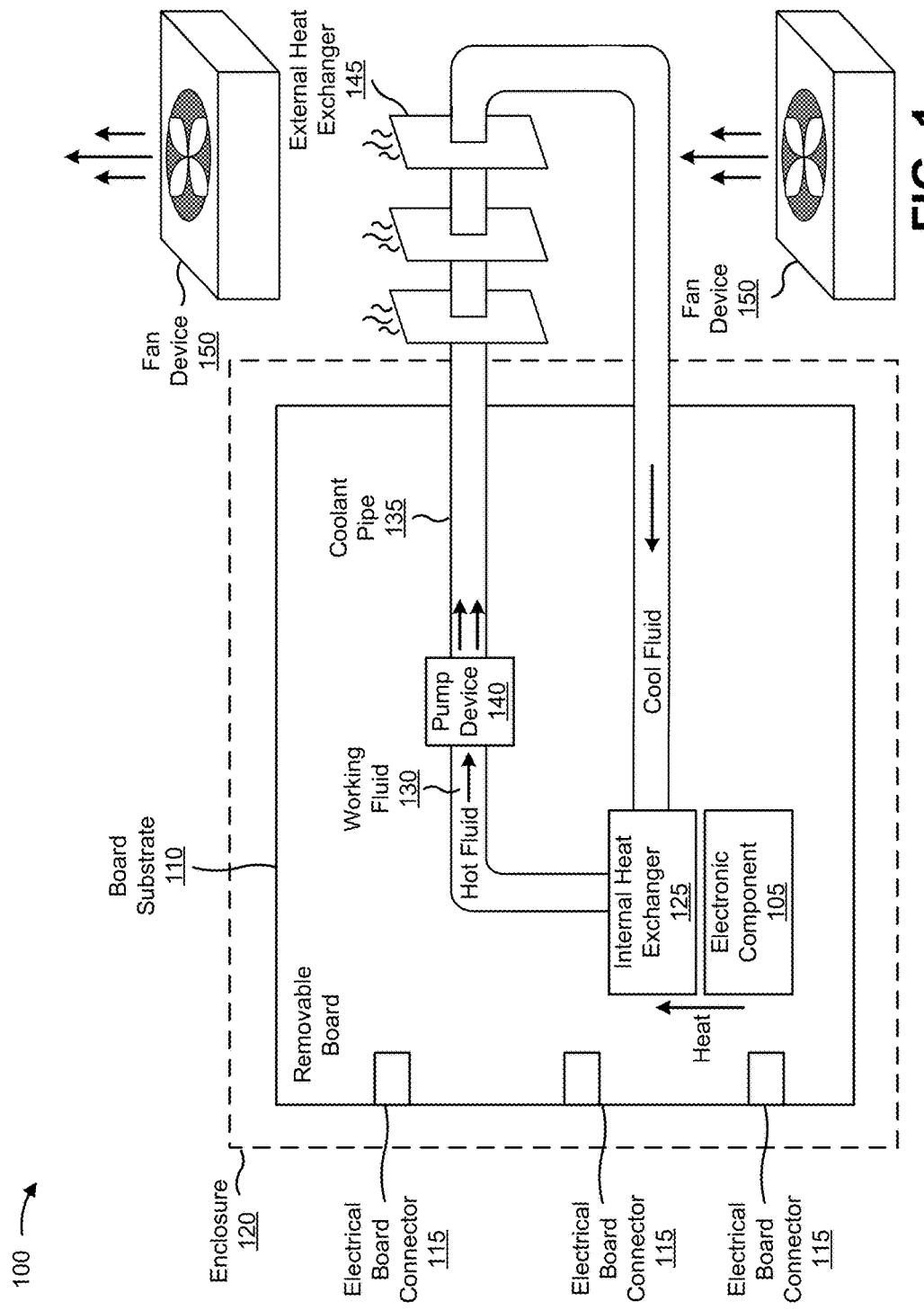
FIG. 1 is a diagram of example components of a removable board.

FIG. 1 is a diagram of an example implementation 100 in which systems and/or methods, described herein, may be implemented. As shown in FIG. 1, example implementation 100 may include an electronic component 105, a board substrate 110, an electrical board connector 115, an enclosure 120, an internal heat exchanger 125, a working fluid 130, a coolant pipe 135, a pump device 140, an external heat exchanger 145, and/or a fan device 150.

Electronic component 105 may include one or more components that generate heat. For example, electronic component 105 may include one or more processors, one or more microprocessors, one or more field-programmable gate arrays (FPGAs), one or more application-specific integrated circuits (ASICs), one or more electronic circuits, one or more integrated circuits, or the like. Electronic component 105 may generate heat when operating and may transfer the generated heat to working fluid 130 via internal heat exchanger 125.

As shown, components of example implementation 100 may be affixed to board substrate 110. Board substrate 110 may include a board, such as a printed circuit board, a printed wiring board, a printed circuit assembly, a printed circuit board assembly, a circuit card assembly, or the like. In some implementations, electronic component 105, electrical board connector 115, and/or one or more components of a cooling system (e.g., internal heat exchanger 125, working fluid 130, coolant pipe 135, pump device 140, and/or external heat exchanger 145) may be affixed to board substrate 110 to form a removable board. In some implementations, enclosure 120 may include a chassis-based mounting system for multiple substrates 110 and/or removable boards of an electronic system. For example, multiple removable boards may be inserted into enclosure 120, and may interconnect via electrical board connectors 115. In some implementations, enclosure 120 may facilitate the mounting of and/or may function as a chassis for the multiple removable boards.

In some implementations, a removable board may be removed from enclosure 120 without detaching one or more components from the removable board. For example, enclosure 120 may include a slot to enable a removable board to be inserted in and/or removed from enclosure 120, while external heat exchanger 145 remains outside enclosure 120, and without detaching any component of the removable board. In other words, the removable board may be inserted in and/or removed from enclosure 120, while external heat exchanger 145 remains attached to the removable board and outside enclosure 120. In this way, the removable board may reduce a quantity of seals, valves, or the like, associated with the cooling system, which may improve reliability and reduce likelihood of a leak of working fluid 130.

Internal heat exchanger 125 may include one or more components that receive and conduct heat from electronic component 105. For example, internal heat exchanger 125 may include a material or a combination of materials (e.g., copper, aluminum, silver, etc.) that is a relatively good thermal conductor, as opposed to a material or a combination of materials that is a relatively poor thermal conductor, such as a silicon-based composite. In some implementations, internal heat exchanger 125 may receive the heat via conductive transfer. For example, internal heat exchanger 125 may share a physical interface with electronic component 105, and may receive the heat via the physical interface. Internal heat exchanger 125 may transfer the heat to working fluid 130 (e.g., shown as "Hot Fluid"), which may be contained in coolant pipe 135. In some implementations, internal heat exchanger 125 may include an evaporator component to cause a phase transition of working fluid 130, as described in more detail below.

Coolant pipe 135 may include a cavity (e.g., a channel, a reservoir, a vessel, a pipe, etc.) that is at least partially filled with working fluid 130. Coolant pipe 135 may receive heat from electronic component 105 via internal heat exchanger 125. For example, coolant pipe 135 may receive the heat from internal heat exchanger 125 via a physical interface between coolant pipe 135 and internal heat exchanger 125. Working fluid 130 may include a fluid suitable for cooling applications. For example, working fluid 130 may include ammonia, carbon dioxide, a non-halogenated hydrocarbon, water, or the like. In some implementations, working fluid 130 may undergo a phase transition. For example, working fluid 130 may shift to a gaseous phase at a first stage of a cooling cycle, and may shift to a liquid phase at a second stage of the cooling cycle. In such cases, working fluid 130 may be selected based on a phase transition temperature at which working fluid 130 shifts from a liquid phase to a gaseous phase, or from the gaseous phase to the liquid phase.

As shown, working fluid 130 may move toward external heat exchanger 145 and/or out of enclosure 120 via coolant pipe 135. In some implementations, working fluid 130 may move without mechanical action (e.g., of pump device 140). For example, working fluid 130 may move based on an orientation of coolant pipe 135, based on a change in temperature of working fluid 130, based on a change in phase of working fluid 130, based on capillary action of coolant pipe 135, or the like. In some implementations, pump device 140 may provide mechanical action to move working fluid 130 through coolant pipe 135. Pump device 140 may include one or more devices and/or components capable of moving working fluid 130 by mechanical action (e.g., a pump, an impeller, etc.). Assume that working fluid 130 transfers heat to external heat exchanger 145, situated outside enclosure 120.

External heat exchanger 145 may include one or more devices and/or components capable of dissipating heat received from working fluid 130 and/or coolant pipe 135. In some implementations, one or more components of external heat exchanger 145 (e.g., one or more flanges, rods, flaps, ridges, rails, etc.) may dissipate heat via conduction to air adjacent to the one or more components. In some implementations, external heat exchanger 145 and/or a component of external heat exchanger 145 may include a material or a combination of materials, such as copper, aluminum, silver, or the like, that is a relatively good thermal conductor, as opposed to a material that is a relatively poor thermal conductor, such as a silicon-based composite. In some implementations, external heat exchanger 145 may include a condenser component, to cause a phase transition of working fluid 130 from a gaseous state to a liquid state. By transferring the heat to external heat exchanger 145, the removable board may facilitate more energy-efficient and effective cooling of electronic component 105.

As shown, in some implementations, one or more fan devices 150 may cool external heat exchanger 145 by moving air past external heat exchanger 145. Fan device 150 may include one or more devices and/or components capable of moving air (e.g., a fan, a ventilator, a blower, etc.). In some implementations, fan device 150 may be situated outside enclosure 120 (e.g., in an orientation to move air past external heat exchanger 145). In some implementations, fan device 150 may move cooled air past external heat exchanger 145. For example, an air conditioning unit, a cooling unit, or the like, may cool the air before fan device 150 moves the air past external heat exchanger 145. By moving the air past external heat exchanger 145, fan device 150 may improve heat dissipation of external heat exchanger 145. Furthermore, by situating fan device 150 outside enclosure 120, the removable board may improve efficiency of fan device 150, may reduce ventilation-related contamination of electronic component 105, and/or may reduce energy expenditure of the removable board.

As shown, working fluid 130, after transferring the heat to external heat exchanger 145, may return to enclosure 120. Assume that working fluid 130 moves to internal heat exchanger 125, via coolant pipe 135, to receive heat from electronic component 105. In some implementations, one or more pump devices 140 may move working fluid 130 toward internal heat exchanger 125.

The number and arrangement of devices and components shown in FIG. 1 are provided as an example. In practice, there may be additional devices and/or components, fewer devices and/or components, different devices and/or components, or differently arranged devices and/or components than those shown in FIG. 1. Furthermore, two or more devices shown in FIG. 1 may be implemented within a single device and/or component, or a single device and/or component shown in FIG. 1 may be implemented as multiple, distributed devices and/or components. Additionally, or alternatively, a set of devices and/or components (e.g., one or more devices and/or components) of example implementation 100 may perform one or more functions described as being performed by another set of devices and/or components of example implementation 100.

Figure 2:
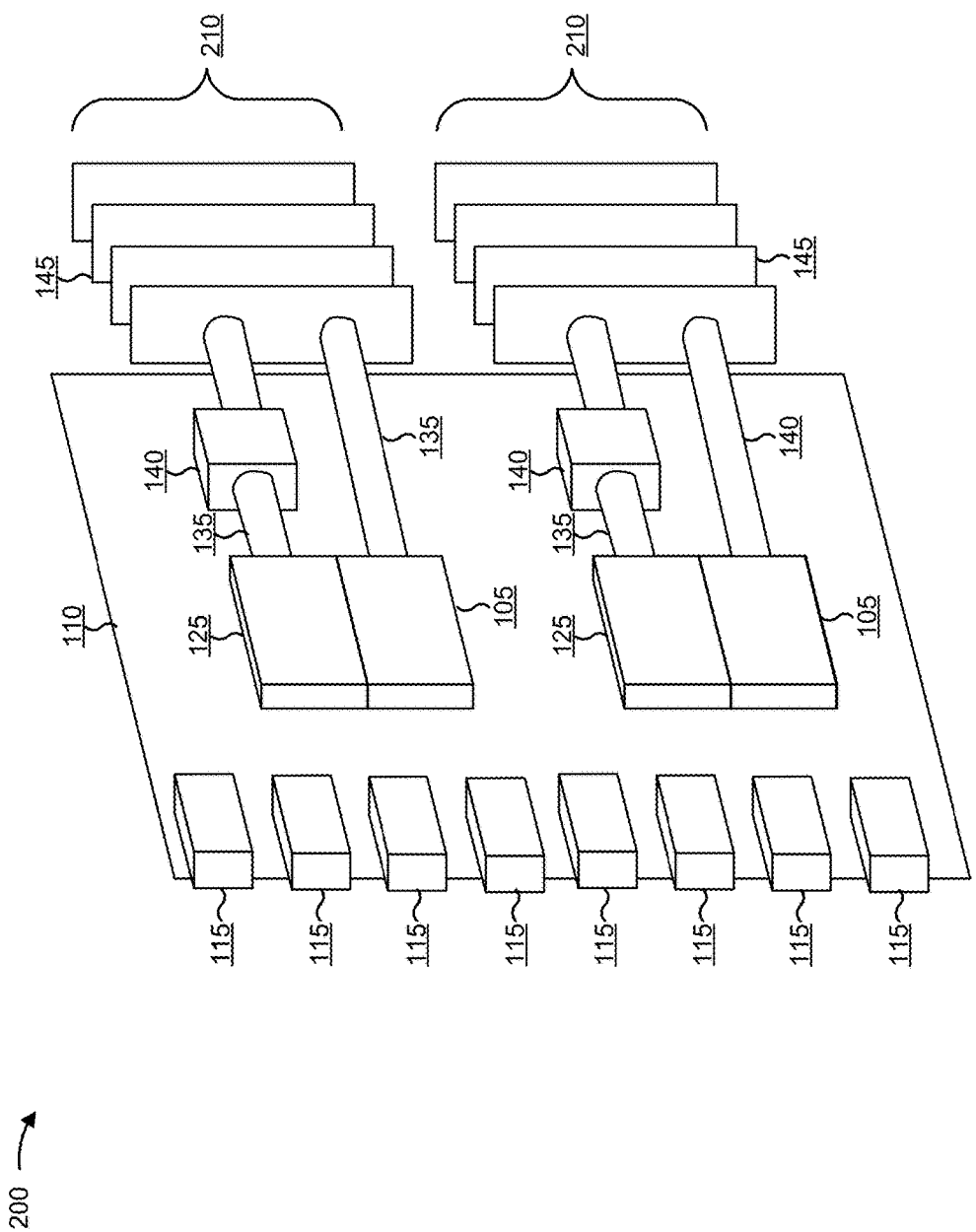
FIG. 2 is a diagram of an example implementation of a vertical removable board that includes components of a removable board, such as components shown in FIG. 1.

FIG. 2 is a diagram of an example implementation of a vertical removable board 200 that includes components of a removable board, such as components shown in FIG. 1. As shown in FIG. 2, in some implementations, vertical removable board 200 may include one or more electronic components 105, a board substrate 110, one or more electrical board connectors 115, one or more internal heat exchangers 125, working fluid 130, one or more coolant pipes 135, one or more pump devices 140, and/or one or more external heat exchangers 145. As further shown, in some implementations, components of vertical removable board 200 may be attached to substrate 110.

As shown, here, external heat exchanger 145 includes fins 210. Assume that fins 210 facilitate cooling of working fluid 130, and assume that fins 210 are manufactured of a metal having a relatively high thermal conductivity (e.g., copper, aluminum, silver, etc.). As further shown, in some implementations, fins 210 may be arranged in a parallel and/or spaced relationship. By arranging fins 210 in a parallel and/or spaced relationship, vertical removable board 200 may facilitate ventilation and/or cooling of external heat exchanger 145.

Assume that vertical removable board 200 is capable of insertion into and removal from enclosure 120 without detaching any component of vertical removable board 200 from substrate 110. Assume further that vertical removable board 200, based on being capable of insertion and removal without detaching any component, contains no detachable seals, detachable pipe junctions, or the like. Based on containing no detachable seals, detachable pipe junctions, or the like, vertical removable board 200 may be more resistant to leaks of working fluid 130 than a cooling system that contains detachable seals, detachable pipe junctions, or the like.

FIG. 2 illustrates one example design for a removable board. In some implementations, a removable board may include, for example, different quantities of fins 210, differently shaped fins 210, or the like.

Figure 3:
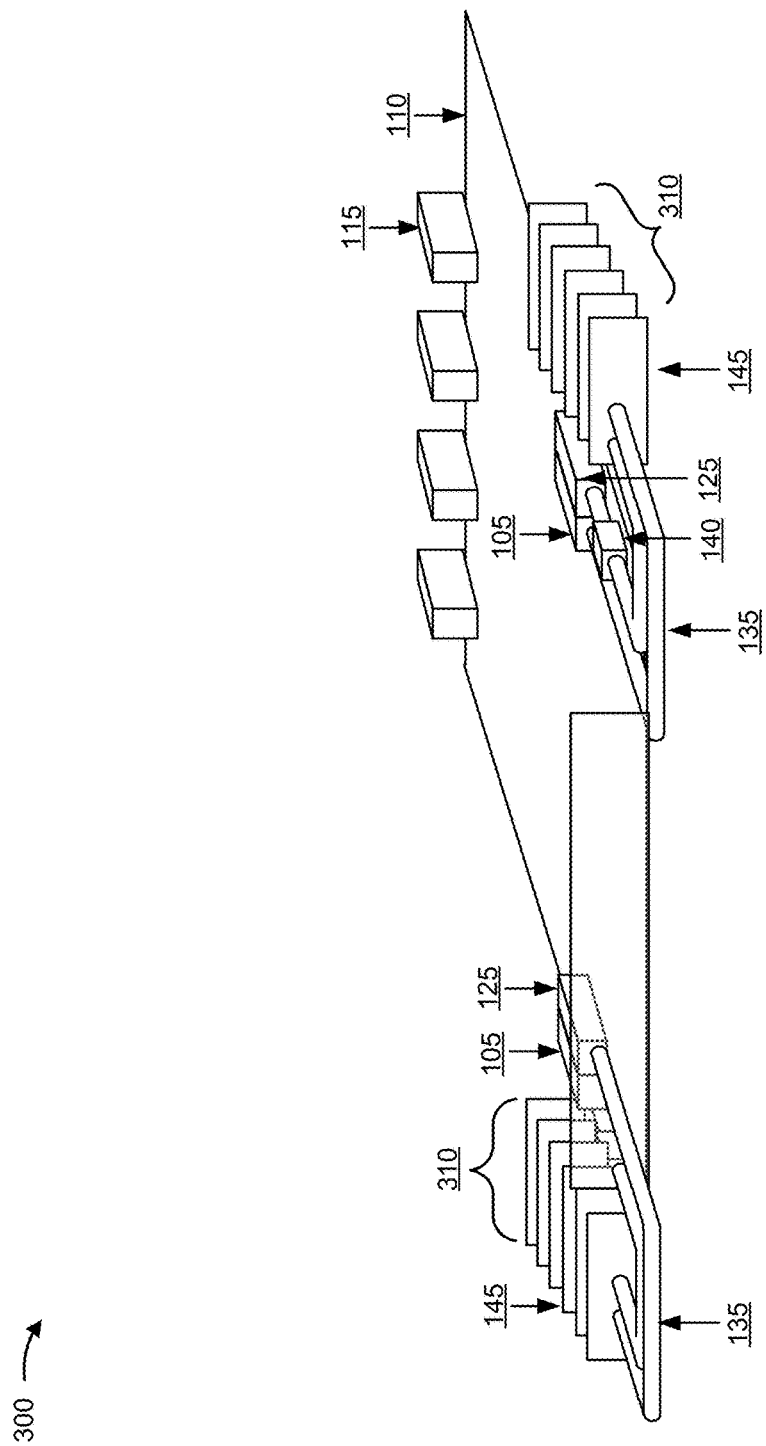
FIG. 3 is a diagram of an example implementation of a horizontal removable board that includes components of a removable board, such as components shown in FIG. 1.

FIG. 3 is a diagram of an example implementation of a horizontal removable board 300 that includes components of a removable board, such as components shown in FIG. 1. As shown in FIG. 3, in some implementations, horizontal removable board 300 may include one or more electronic components 105, one or more electrical board connectors 115, one or more internal heat exchangers 125, working fluid 130, one or more coolant pipes 135, one or more pump devices 140, and/or one or more external heat exchangers 145. As further shown, in some implementations, components of horizontal removable board 300 may be attached to substrate 110.

As shown by FIG. 3, in some implementations, external heat exchanger 145 of horizontal removable board 300 may include fins 310. Assume that fins 310 facilitate cooling of working fluid 130, and assume that fins 310 are manufactured of a material having a relatively high thermal conductivity (e.g., copper, aluminum, silver, etc.). As further shown, in some implementations, fins 310 may be arranged in a parallel and/or spaced relationship. By arranging fins 310 in a parallel and/or spaced relationship, horizontal removable board 300 may facilitate ventilation and/or cooling of external heat exchanger 145.

Assume that horizontal removable board 300 is capable of insertion into and removal from enclosure 120 without disconnecting any component of horizontal removable board 300 from substrate 110. Assume further that horizontal removable board 300, based on being capable of insertion and removal without disconnecting any component, contains no detachable seals, detachable pipe junctions, or the like. Based on containing no detachable seals, detachable pipe junctions, or the like, horizontal removable board 300 may be more resistant to leaks of working fluid 130 than a cooling system that contains detachable seals, detachable pipe junctions, or the like.

FIG. 3 illustrates one example design for a removable board. In some implementations, a removable board may include, for example, different quantities of fins 310, differently shaped fins 310, or the like.

Figure 4:
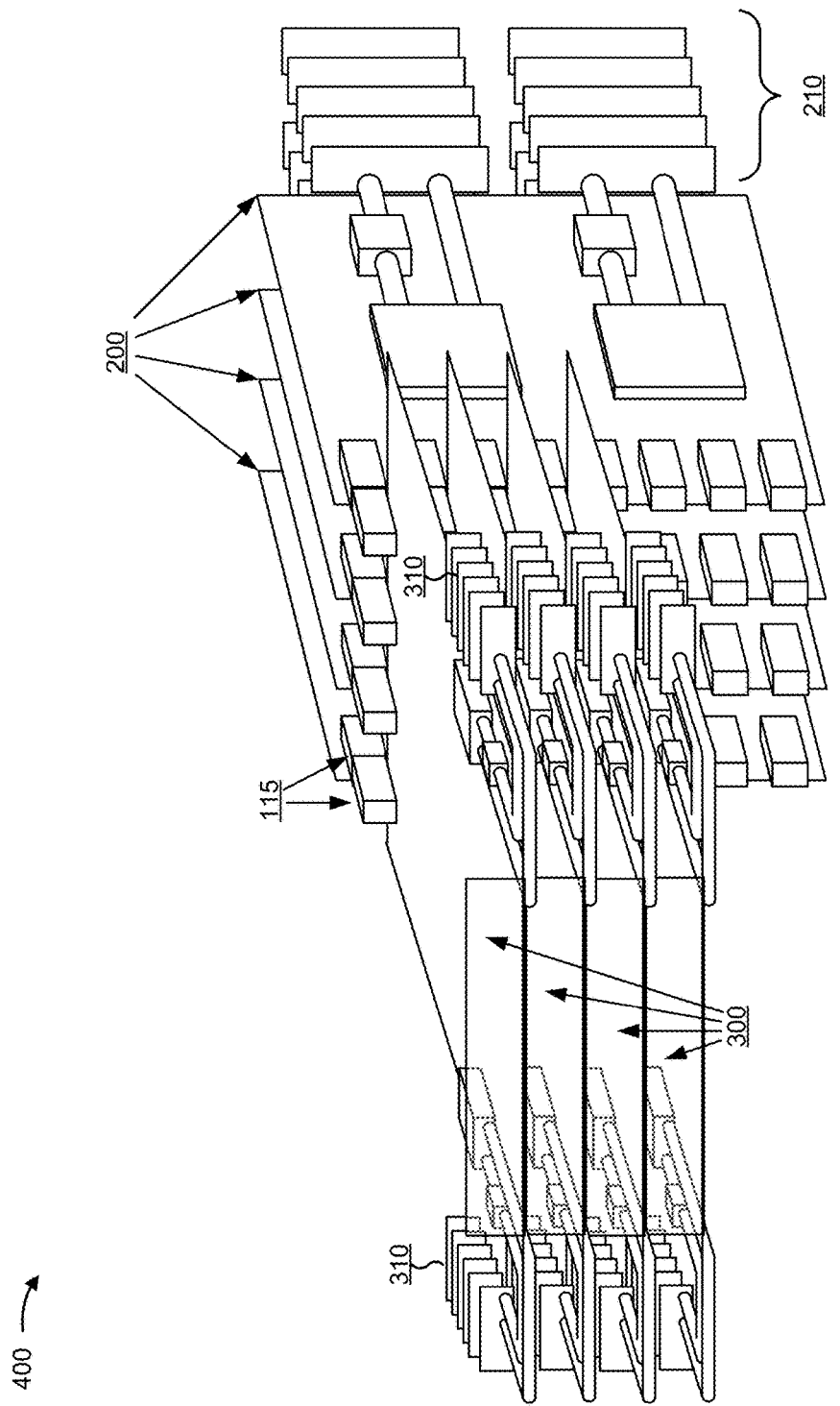
FIG. 4 is a diagram of an example implementation that includes the example implementations shown in FIGS. 2 and 3.

FIG. 4 is a diagram of an example implementation 400 that includes the example implementations shown in FIGS. 2 and 3. FIG. 4 shows an example of multiple vertical removable boards 200 and multiple horizontal removable boards 300.

As shown in FIG. 4, vertical removable board 200 and horizontal removable board 300 may connect via electrical board connectors 115. As further shown, in some implementations, multiple vertical removable boards 200 may interconnect with multiple horizontal removable boards 300. As shown, multiple fins 210 and/or fins 310 of external heat exchangers 145 (e.g., of vertical removable board 200 and/or horizontal removable board 300) may be situated in a spaced relationship. In some implementations, the multiple fins 210 and/or fins 310 of the multiple heat exchangers 145 may be situated in the spaced relationship to improve airflow across and/or heat dissipation of the multiple heat exchangers 145.

As indicated above, FIG. 4 is provided merely as an example. Other examples are possible and may differ from what was described with regard to FIG. 4. In some implementations, for example, the multiple vertical removable boards 200 and/or the multiple horizontal removable boards 300 may be arranged in a different orientation, and/or may differ in implementation of external heat exchanger 145 (e.g., external heat exchanger 145 may use a different quantity of fins, may be situated in a different spaced relationship, may be oriented differently, etc.).

Figure 5:
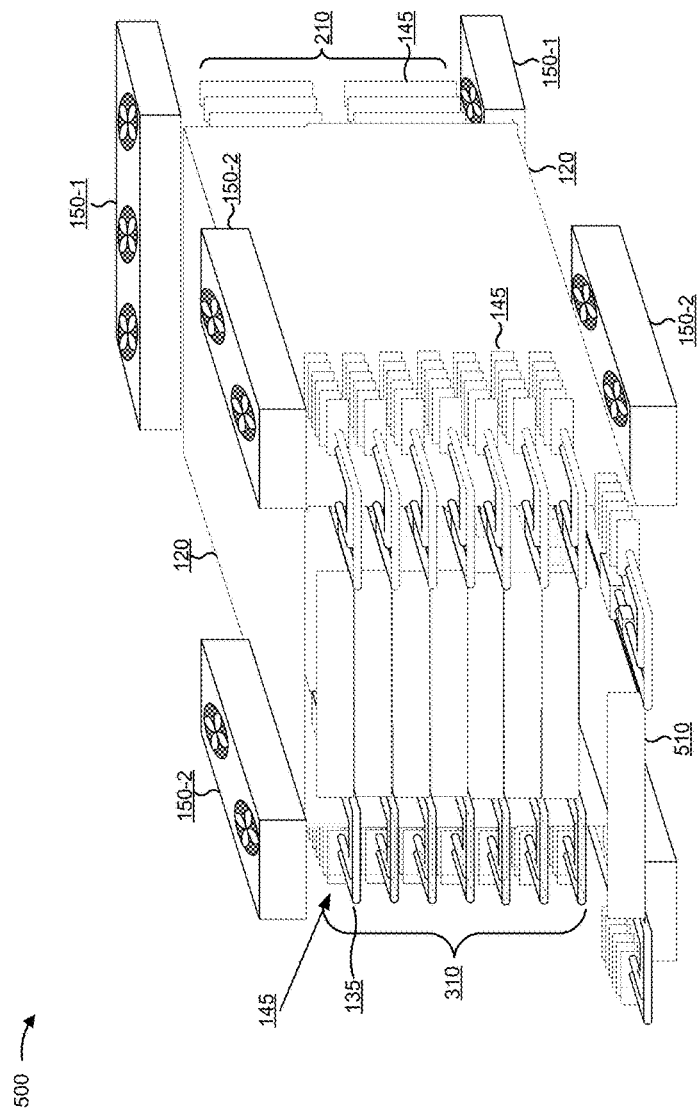
FIG. 5 is a diagram of an example implementation of a chassis-based electronic system that includes an example implementation, such as the example implementation shown in FIG. 4.

FIG. 5 is a diagram of an example implementation of a chassis-based electronic system 500 that includes an example implementation, such as the example implementation 400 shown in FIG. 4.

As shown in FIG. 5, enclosure 120 may enclose multiple vertical removable boards 200 and multiple horizontal removable boards 300. As shown, multiple external heat exchangers 145 may be situated outside enclosure 120. By situating the multiple external heat exchangers 145 outside enclosure 120, chassis-based electronic system 500 may permit more cost-effective and/or efficient cooling of electronic component 105. Removable boards 200/300 and/or enclosure 120 facilitate insertion and/or removal of removable boards 200/300 without removing any component of removable boards 200/300. Here, for example, horizontal removable board 300 is installed by inserting horizontal removable board 300 into an opening of enclosure 120, as shown by reference number 510. As further shown, coolant pipe 135 extends through the opening, and external heat exchanger 145 is situated outside enclosure 120 at an end of coolant pipe 135.

As further shown, in some implementations, one or more fan devices 150 may be situated to move air to cool the multiple external heat exchangers 145. As shown, a first set of fan devices 150-1 may move air to cool fins 210 of vertical removable boards 200. As further shown, a second set of fan devices 150-2 may move air to cool fins 310 of horizontal removable boards 300. As shown, fins 210 and fins 310 of the multiple external heat exchangers 145 may be arranged in a spaced relationship to facilitate the cooling. As further shown, fan device 150-1 and fan device 150-2 may move air in a direction parallel to an orientation of the rectangular components of the multiple external heat exchangers 145.

As indicated above, FIG. 5 is provided merely as an example. Other examples are possible and may differ from what was described with regard to FIG. 5. In some implementations, for example, the multiple removable boards 200/300 may be arranged in a different orientation, and/or may differ in implementation of external heat exchanger 145 (e.g., external heat exchanger 145 may use a different quantity of fins, may be situated in a different spaced relationship, may be oriented differently, etc.).

Figure 6:
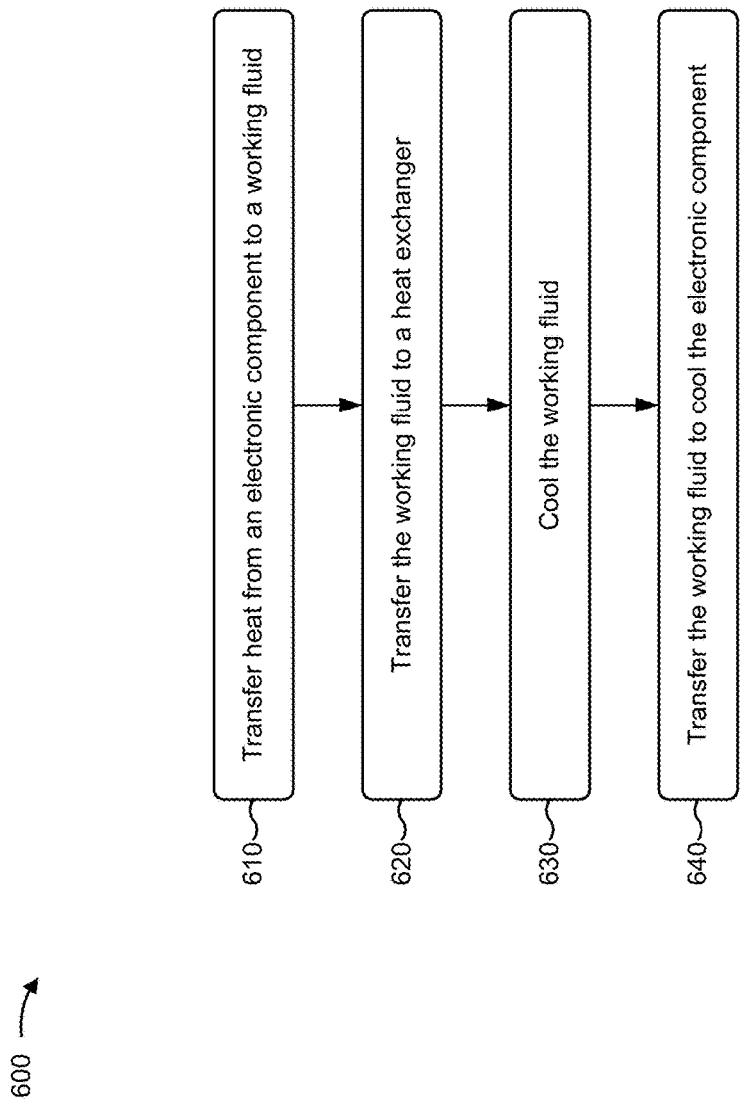
FIG. 6 is a flow chart of an example process for managing heat generated by a chassis-based electronic system.

FIG. 6 is a flow chart of an example process 600 for managing heat generated by a chassis-based electronic system. In some implementations, one or more process blocks of FIG. 6 may be performed by one or more components of a cooling system implemented on removable boards 200/300.

As shown in FIG. 6, process 600 may include transferring heat from an electronic component to a working fluid (block 610). For example, internal heat exchanger 125 may receive heat that is generated as a byproduct of operation of electronic component 105. Internal heat exchanger 125 may transfer the heat from electronic component 105 to working fluid 130, contained in coolant pipe 135, for transfer to external heat exchanger 145.

In some implementations, internal heat exchanger 125 may share a physical interface with electronic component 105. For example, internal heat exchanger 125 may include a component, such as a metal plate or the like, that is in physical contact with electronic component 105. Internal heat exchanger 125 may receive heat from electronic component 105 via conduction to the component.

In some implementations, working fluid 130 and/or coolant pipe 135 may pass through a portion of internal heat exchanger 125 that exposes working fluid 130 and/or coolant pipe 135 to heat from electronic component 105. In some implementations, internal heat exchanger 125 may heat working fluid 130 via conduction from electronic component 105. For example, internal heat exchanger 125 and/or coolant pipe 135 may receive heat via direct contact with electronic component 105, and may transfer the heat to working fluid 130.

In some implementations, working fluid 130 may remain in a particular state (e.g., a liquid state, a gaseous state, etc.) for an entirety of process 600, which may simplify design, implementation, and/or maintenance of removable board 200/300. In some implementations, internal heat exchanger 125 may function as an evaporator of a phase-transition cooling system. For example, internal heat exchanger 125 may receive working fluid 130 in a liquid state, and may transfer heat to working fluid 130 from electronic component 105. The heat may raise a temperature of working fluid 130 to or above a phase transition temperature of working fluid 130. Working fluid 130 may evaporate, and may move toward external heat exchanger 145 (e.g., based on the evaporating, based on mechanical action of one or more pump devices 140, etc.) in a vapor state. In this way, removable board 200/300 may perform phase-transition cooling operations, which may improve efficiency of a cooling system of removable board 200/300.

A designer of removable board 200/300 may select whether to implement a phase-transition cooling system or a non-phase-transition cooling system, in some implementations. For example, a phase-transition cooling system may more effectively cool electronic component 105, but may require more careful calibration, design, and/or maintenance than a non-phase-transition cooling system. As another example, a phase-transition cooling system may require additional and/or different components than a non-phase-transition cooling system, such as an internal heat exchanger 125 capable of evaporating working fluid 130 and/or an external heat exchanger 145 capable of condensing working fluid 130. As yet another example, a non-phase-transition cooling system may cool electronic component 105 less effectively than a phase-transition cooling system, and may be operable in a wider range of conditions (e.g., temperatures, pressure ranges, etc.) than a phase-transition cooling system. The designer may design the cooling system and/or removable board 200/300 based on one or more of the above considerations.

As further shown in FIG. 6, process 600 may include transferring the working fluid to a heat exchanger (block 620). For example, coolant pipe 135 may transfer working fluid 130 toward external heat exchanger 145 and/or out of enclosure 120 for cooling and/or condensing. In some implementations, one or more pump devices 140 may move (e.g., impel) working fluid 130. Additionally, or alternatively, working fluid 130 may move without mechanical action from pump device 140. For example, working fluid 130 may move along coolant pipe 135 based on a thermal expansion of working fluid 130, based on a phase transition of working fluid 130, based on capillary action induced by coolant pipe 135, based on an orientation of coolant pipe 135, or the like.

In some implementations, working fluid 130 may be in a gaseous state while moving toward external heat exchanger 145. For example, internal heat exchanger 125 may evaporate working fluid 130. In other implementations, working fluid 130 may be in a liquid state while moving toward external heat exchanger 145. For example, working fluid 130 may not undergo a phase transition in connection with block 610 of FIG. 6, which may simplify implementation and/or maintenance of the cooling system and/or removable board 200/300.

As further shown in FIG. 6, process 600 may include cooling the working fluid (block 630). For example, working fluid 130 may transfer heat to external heat exchanger 145, which may cool working fluid 130. External heat exchanger 145 may be situated outside enclosure 120, and may dissipate heat received from working fluid 130 and/or coolant pipe 135. By transferring the heat to external heat exchanger 145, removable board 200/300 may dissipate heat outside enclosure 120, which may improve effectiveness and/or efficiency of removable board 200/300, decrease contamination of electronic component 105, or the like.

In some implementations, external heat exchanger 145 may function as a condenser of a phase-transition removable board 200/300. For example, external heat exchanger 145 may receive heat from a gaseous working fluid 130, which may lower a temperature of the gaseous working fluid 130 below a phase transition temperature. Based on the temperature being below the phase transition temperature, the gaseous working fluid 130 may condense to a liquid phase, and may move into enclosure 120 via coolant pipe 135 (e.g., to receive heat from electronic component 105 and/or internal heat exchanger 125).

In some implementations, one or more fan devices 150, situated outside of enclosure 120, may dissipate heat from external heat exchanger 145 by moving, across external heat exchanger 145, air that is cooler than external heat exchanger 145. By implementing the one or more fan devices 150 outside of enclosure 120, removable board 200/300 may simplify implementation, improve efficiency, decrease ventilation-related contamination of electronic component 105, and/or increase effectiveness of external heat exchanger 145 and/or fan device 150.

In some implementations, external heat exchanger 145 may be configured to improve airflow caused by fan device 150. For example, external heat exchanger 145 may include one or more components to dissipate heat outside enclosure 120. Fan device 150 may move air in relation to (e.g., across, past, parallel to, etc.) the one or more components. In some implementations, the one or more components may be of a shape to improve the movement of the air. The shape may include a flange, a fin, a rod, a rail, or the like, that may be oriented in a particular orientation to permit the air to move more easily past the one or more components. In this way, external heat exchanger 145 may improve efficiency of removable board 200/300 and/or fan device 150 by improving airflow of the air that dissipates heat from external heat exchanger 145.

In some implementations, fan device 150 may cool air before moving the air across external heat exchanger 145. For example, fan device 150 may include an air conditioning unit, a cooling unit, or the like, that may decrease a temperature of the air. By decreasing the temperature of the air, fan device 150 may more effectively dissipate heat from external heat exchanger 145.

As further shown in FIG. 6, process 600 may include transferring the working fluid to cool the electronic component (block 640). For example, working fluid 130 may move into enclosure 120 via coolant pipe 135. In some implementations, one or more pump devices 140 may impel movement of working fluid 130. Working fluid 130 may move to internal heat exchanger 125 to dissipate heat from electronic component 105, and may perform one or more of the operations described above.

Although FIG. 6 shows example blocks of process 600, in some implementations, process 600 may include additional blocks, fewer blocks, different blocks, or differently arranged blocks than those depicted in FIG. 6. Additionally, or alternatively, two or more of the blocks of process 600 may be performed in parallel.

In this way, a cooling system may remove heat from an electronic component, and may transfer the heat out of an enclosure that encloses the electronic component. Fans may cool an external heat exchanger to dissipate the heat, which may require less energy than dissipating the heat within the enclosure. Furthermore, the cooling system may be attached to a removable board that is easily inserted into and/or removed from the enclosure, which may permit easier installation, maintenance, repair, and/or de-installation of the electronic component and/or the cooling system.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the terms "group" and "set" are intended to include one or more items (e.g., related items, unrelated items, a combination of related items and unrelated items, etc.), and may be used interchangeably with "one or more." Where only one item is intended, the term "one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A system, comprising: an enclosure; and a plurality of removable boards inserted within the enclosure, the plurality of removable boards comprising: a set of vertical removable boards associated with a first set of external heat exchanges, and a set of horizontal removable boards associated with a second set of external heat exchangers, and a removable board of the plurality of removable boards comprising: a substrate; an electronic component attached to the substrate; an internal heat exchanger to receive heat from the electronic component, the internal heat exchanger being attached to at least one of the electronic component or the removable board; a coolant pipe that is at least partially filled with a working fluid and that is attached to the internal heat exchanger; an external heat exchanger that is located external to the enclosure and that is attached to the coolant pipe to dissipate the heat from the electronic component, the heat from the electronic component being dissipated by a fan device located external to the enclosure, the fan device including a cooling unit or an air conditioning unit to cool air before moving the air across the external heat exchanger, and the fan device being one of a set of fan devices, a first set of fan devices, of the set of fan devices, to move air to cool a set of fins of the first set of external heat exchangers, and a second set of fan devices, of the set of fan devices, to move air to cool a set of fins of the second set of external heat exchangers; and a pump device, attached to the coolant pipe, to impel the working fluid toward the external heat exchanger; and the removable board facilitating insertion into and removal from the enclosure without removing any component of the removable board.

2. The system of claim 1, where the removable board is a first removable board; and
where the system further comprises:
a first electrical board connector that is attached to the first removable board;
a second removable board of the plurality of removable boards; and
a second electrical board connector that is attached to the second removable board,
the second removable board connecting to the first removable board via the first electrical board connector and the second electrical board connector.

3. The system of claim 2, where the first removable board is oriented in a first orientation; and
where the second removable board is oriented in a second orientation that is different than the first orientation.

4. The system of claim 1, where the external heat exchanger further comprises a plurality of fins that are oriented in a uniform orientation.

5. The system of claim 4, where the fan device is oriented to move air in a direction that is parallel to the uniform orientation.

6. The system of claim 1, where the internal heat exchanger includes an evaporator component to evaporate the working fluid from a liquid state to a gaseous state; and
where the external heat exchanger includes a condenser component to condense the working fluid from the gaseous state to the liquid state.

7. The system of claim 1, where the internal heat exchanger is further to:
transfer the heat from the electronic component to the working fluid.

8. The system of claim 1, where one or more fan devices are situated to cool multiple heat exchangers.

9. The system of claim 1, where the working fluid is moved to the internal heat exchanger to dissipate heat from the electronic component.

10. A removable board, that is adapted to be inserted into and to be removed from an enclosure, comprising: a substrate; an electronic component attached to the substrate; an internal heat exchanger that shares a physical interface with the electronic component to dissipate heat generated by the electronic component; a coolant pipe attached to the internal heat exchanger, the coolant pipe being at least partially filled with a working fluid; an external heat exchanger that is attached to the coolant pipe to dissipate heat from the working fluid, the external heat exchanger being situated externally to the enclosure when the removable board is inserted into the enclosure, and the heat from the working fluid being dissipated by a fan device located external to the enclosure, the fan device including a cooling unit or an air conditioning unit to cool air before moving the air across the external heat exchanger, and the fan device being one of a set of fan devices, a first set of fan devices, of the set of fan devices, to move air to cool a set of fins of a first set of external heat exchangers associated with a set of vertical removable boards, and a second set of fan devices, of the set of fan devices, to move air to cool a set of fins of a second set of external heat exchangers associated with a set of horizontal removable boards; and a pump device, attached to the coolant pipe, to impel the working fluid toward the external heat exchanger.

11. The removable board of claim 10, where the external heat exchanger further comprises: a plurality of fins that are oriented in a uniform orientation.

12. The removable board of claim 10, where the internal heat exchanger includes an evaporator component to evaporate the working fluid from a liquid state to a gaseous state; and where the external heat exchanger includes a condenser component to condense the working fluid from the gaseous state to the liquid state.

13. The removable board of claim 10, where the removable board is oriented in a first orientation; and
where the removable board further comprises:
one or more electrical board connectors to connect the removable board to one or more other removable boards,
the one or more other removable boards being oriented in a second orientation that is different than the first orientation.

14. The removable board of claim 10, where the working fluid remains in a particular state.

15. A system comprising: a plurality of removable boards comprising: a set of vertical removable boards associated with a first set of external heat exchangers; and a set of horizontal removable boards associated with a second set of external heat exchangers, a removable board, of the plurality of removable boards being, adapted for inserting into and removing from an enclosure; an electronic component that is attached to the removable board; and a cooling system that is attached to the removable board, the cooling system comprising: an internal heat exchanger that is attached to the electronic component by a physical interface; a coolant pipe that is at least partially filled with a working fluid to receive heat, generated by the electronic component, via the internal heat exchanger; an external heat exchanger, attached to the coolant pipe and situated to be located outside of the enclosure when the removable board is inserted into the enclosure, the heat being dissipated by a fan device located external to the enclosure, the fan device including a cooling unit or an air conditioning unit to cool air before moving the air across the external heat exchanger, and the fan device being one of a set of fan devices, a first set of fan devices, of the set of fan devices, to move air to cool a set of fins of the first set of external heat exchangers, and a second set of fan devices, of the set of fan devices, to move air to cool a set of fins of the second set of external heat exchangers; and a pump device, attached to the coolant pipe, to impel the working fluid toward the external heat exchanger; and the cooling system being adapted to remain attached to the removable board when inserting and removing the removable board.

16. The system of claim 15, where the internal heat exchanger further comprises an evaporator component to evaporate the working fluid; and where the external heat exchanger further comprises a condenser component to condense the working fluid.

17. The system of claim 15, where the external heat exchanger further comprises: a plurality of fins that are oriented in a uniform orientation.

18. The system of claim 17, where the fan device causes air to move in a direction parallel to the uniform orientation of the plurality of fins.

19. The system of claim 15, further comprising:
one or more electrical board connectors to connect the removable board to one or more other removable boards within the enclosure.

20. The system of claim 15, where the heat is transferred to the working fluid.

* * * * *